(12) United States Patent
Chiu et al.

(10) Patent No.: US 10,262,839 B2
(45) Date of Patent: Apr. 16, 2019

(54) ALUMINUM APPARATUS WITH ALUMINUM OXIDE LAYER AND METHOD FOR FORMING THE SAME

(71) Applicant: TAIWAN SEMICONDUCTOR MANUFACTURING CO., LTD., Hsinchu (TW)

(72) Inventors: Ru-Chien Chiu, Hsinchu (TW); Bing-Hung Chen, San-Xia Town (TW); Keith Kuang-Kuo Koai, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 383 days.

(21) Appl. No.: 15/182,334

(22) Filed: Jun. 14, 2016

(65) Prior Publication Data
US 2017/0358430 A1    Dec. 14, 2017

(51) Int. Cl.
*H01J 37/32* (2006.01)
*C25D 11/04* (2006.01)
*C25D 11/24* (2006.01)

(52) U.S. Cl.
CPC ...... *H01J 37/32495* (2013.01); *C25D 11/045* (2013.01); *C25D 11/246* (2013.01); *H01J 37/32467* (2013.01)

(58) Field of Classification Search
CPC .......... H01J 37/32495; H01J 37/32467; C25D 11/24; C25D 11/16
See application file for complete search history.

(56) References Cited

U.S. PATENT DOCUMENTS

2010/0051581 A1* 3/2010 Chiou .................. C23C 14/564
216/37

OTHER PUBLICATIONS

Military Specification Amendment MIL-A-8625F, "Anodic Coatings for Aluminum and Aluminum Alloys", dated Sep. 15, 2003, 19 pages.
Fang Guo et al., "Glow Discharge Plasma-Assisted Preparation of Nickel-Based Catalyst for Carbon Dioxide Reforming of Methane", Chinese Journal of Chemical Physics, Vo. 21, No. 5, Oct. 27, 2008, pp. 481-486.

* cited by examiner

*Primary Examiner* — Jessee R Roe
(74) *Attorney, Agent, or Firm* — McDermott Will & Emery LLP

(57) ABSTRACT

In a method, an aluminum body is chemically treated with at least one of an alkaline solution and an acid solution. Anode-oxidization is performed on the chemically treated aluminum body to form an aluminum oxide layer. The aluminum oxide layer is treated with hot water at a temperature more than 75° C. or steam. The aluminum oxide layer after being treated with hot water or steam includes plural columnar grains, and an average width of the columnar grains is in a range from 10 nm to 100 nm.

20 Claims, 7 Drawing Sheets

D1

D2

D3

ALUMINUM APPARATUS WITH ALUMINUM OXIDE LAYER AND METHOD FOR FORMING THE SAME

TECHNICAL FIELD

The disclosure relates to methods for manufacturing aluminum oxide (alumina) layers on an aluminum body material and the aluminum oxide layers formed by the methods, and also to vacuum chambers made of aluminum for plasma processes in semiconductor manufacturing.

BACKGROUND

Plasma processes, such as plasma etching, plasma enhanced chemical vapor deposition (CVD), plasma cleaning, and the like, are widely used in manufacturing semiconductor devices. Aluminum is used as a main material of vacuum chambers, in which plasma is generated, and inner surfaces of the vacuum chambers and/or parts used inside the vacuum chambers are formed to have an aluminum oxide layer (i.e., alumina coating) to improve durability of the vacuum chambers.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device/apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
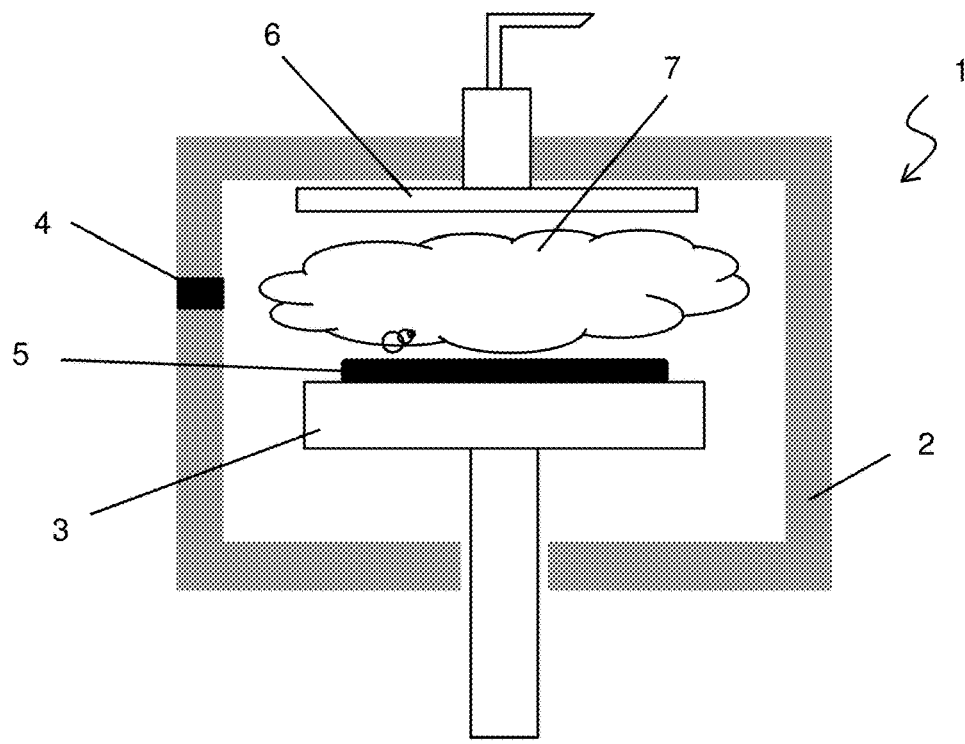
FIG. 1 shows an exemplary schematic view of a vacuum chamber for a plasma process according to one embodiment of the present disclosure.

FIG. 1 shows an exemplary schematic view of a vacuum chamber for a plasma process according to one embodiment of the present disclosure. A vacuum chamber 1 includes a chamber wall 2 as a main body of the vacuum chamber 1, a wafer stage 3, and a wafer transfer port 4 and a gas introduction port 6. The vacuum chamber 1 can be used for plasma etching, plasma enhanced CVD or plasma cleaning.

In a case of plasma CVD, a wafer 5 is transferred into the vacuum chamber 1 through the wafer transfer port 4 and is placed on the wafer stage 3. One or more source gases are introduced into the vacuum chamber through the gas introduction port 6. Plasma 7 is generated by an electric field applied from, for example outside the vacuum chamber by a power supply (not shown). The plasma decomposes the one or more source gases and the decomposed gases react and form a film over the substrate 5. In some plasma processes, the plasma is generated at a remote location from the wafer and the decomposed gases (including radicals) generated by the plasma are transferred by a gas flow to the wafer location.

Figure 2:
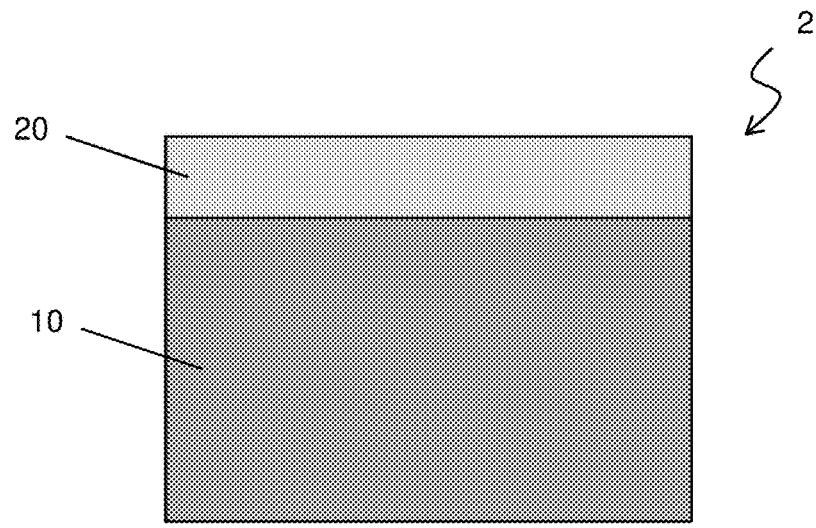
FIG. 2 shows an exemplary cross sectional view of a chamber wall of the vacuum chamber for a plasma process according to one embodiment of the present disclosure.

FIG. 2 shows an exemplary cross sectional view of the chamber wall 2 of the vacuum chamber 1. The chamber wall 2 is made of aluminum (aluminum body) 10, and the inner surface of the chamber wall 2, which is in contact with the generated plasma or radicals, is coated by an aluminum oxide layer 20. It is noted that the outer surface of the chamber wall 2 may also have an aluminum oxide coating layer. The inventors of the present application have found that micro (or nano) structures of the aluminum oxide layer 20 affect stability of the plasma process (CVD, etching, etc.).

Figure 3:
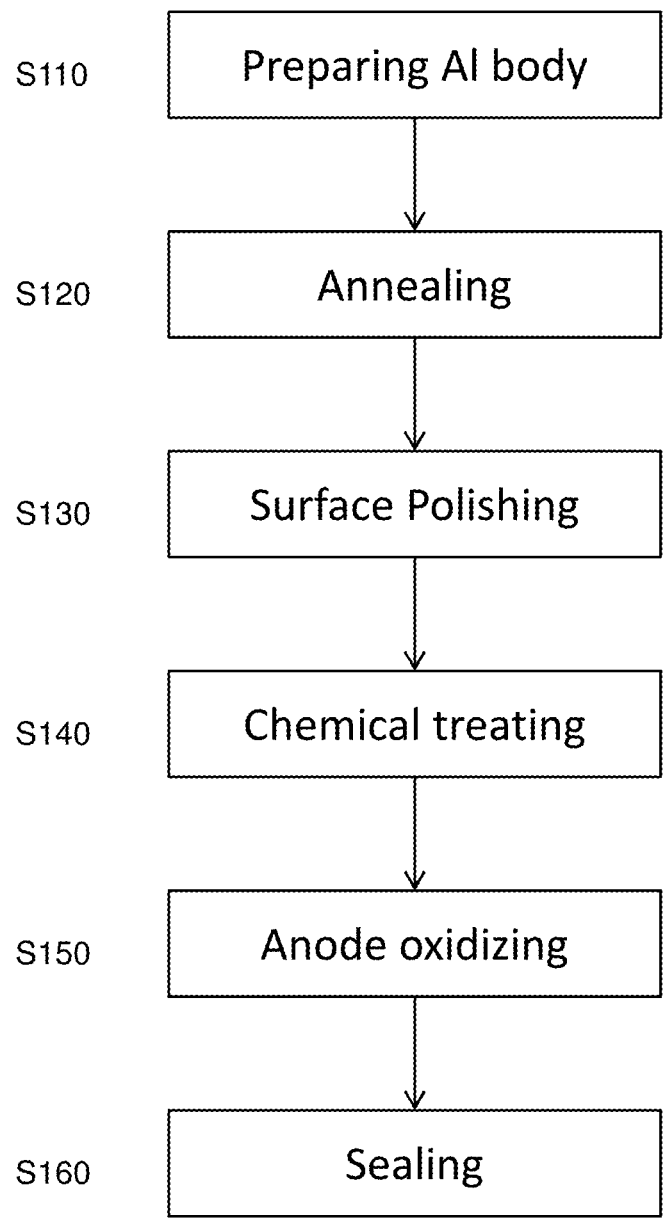
FIG. 3 shows an exemplary flowchart illustrating a method of manufacturing an aluminum layer.

FIG. 3 shows an exemplary flowchart illustrating a method of manufacturing an aluminum layer. It is understood that additional operations can be provided before, during, and after the processes shown by FIG. 3, and some of the operations described below can be replaced or eliminated for additional embodiments of the method. The order of the operations/processes may be interchangeable.

In S110, an aluminum body 10, for example, having a desired shape, is prepared.

In S120, the aluminum body 10 is annealed. A temperature of the annealing is in a range from about 200° C. to 400° C. in some embodiments, and is in a range from about 250° C. to 350° C. in other embodiments. The annealing is performed for time duration in a range from about one hour to about 50 hours in some embodiments, and in a range from about 2 hours to about 8 hours in other embodiments. The annealing is performed in an atmospheric ambient in one embodiment.

In S130, after the annealing, the aluminum body is polished by mechanically and/or chemically using acid. After polishing, the surface roughness (Ra: arithmetic average) of the aluminum body is in a range from about 0.5 μm to about 1.5 μm in some embodiments, and in a range from about 1.1 μm to 1.3 μm in other embodiments. The surface roughness affects not only following aluminum oxide layer growth, but also resistance/impedance of the aluminum oxide layer 20.

In S140, after the polishing, the aluminum body 10 is chemically treated to remove metal particles on the surface of the aluminum body 10. The aluminum body 10 is cleaned (washed) by using an alkaline solution, such as KOH and NaOH, and an acid solution, such as $HNO_3$ and $H_2SO_4$. In some embodiments, the aluminum body 10 is treated by an alkaline solution (e.g., NaOH) for about 60 seconds to about 120 seconds at a temperature of about 50° C. to 70° C., and after the alkaline treatment, the aluminum body 10 is treated by an acid solution (e.g., $HNO_3$) for about 10 seconds to about 50 seconds at a temperature of about 20° C. to 40° C. In certain embodiments, the acid treatment is performed before the alkaline treatment.

In S150, after the chemical treatment, the aluminum oxide layer 20 is formed on the surface of the aluminum body 10 by using anode oxidation. In the anode oxidation, an aluminum body 10 is immersed in an electrolyte solution and a positive voltage is applied to the aluminum body 10.

Figure 4:
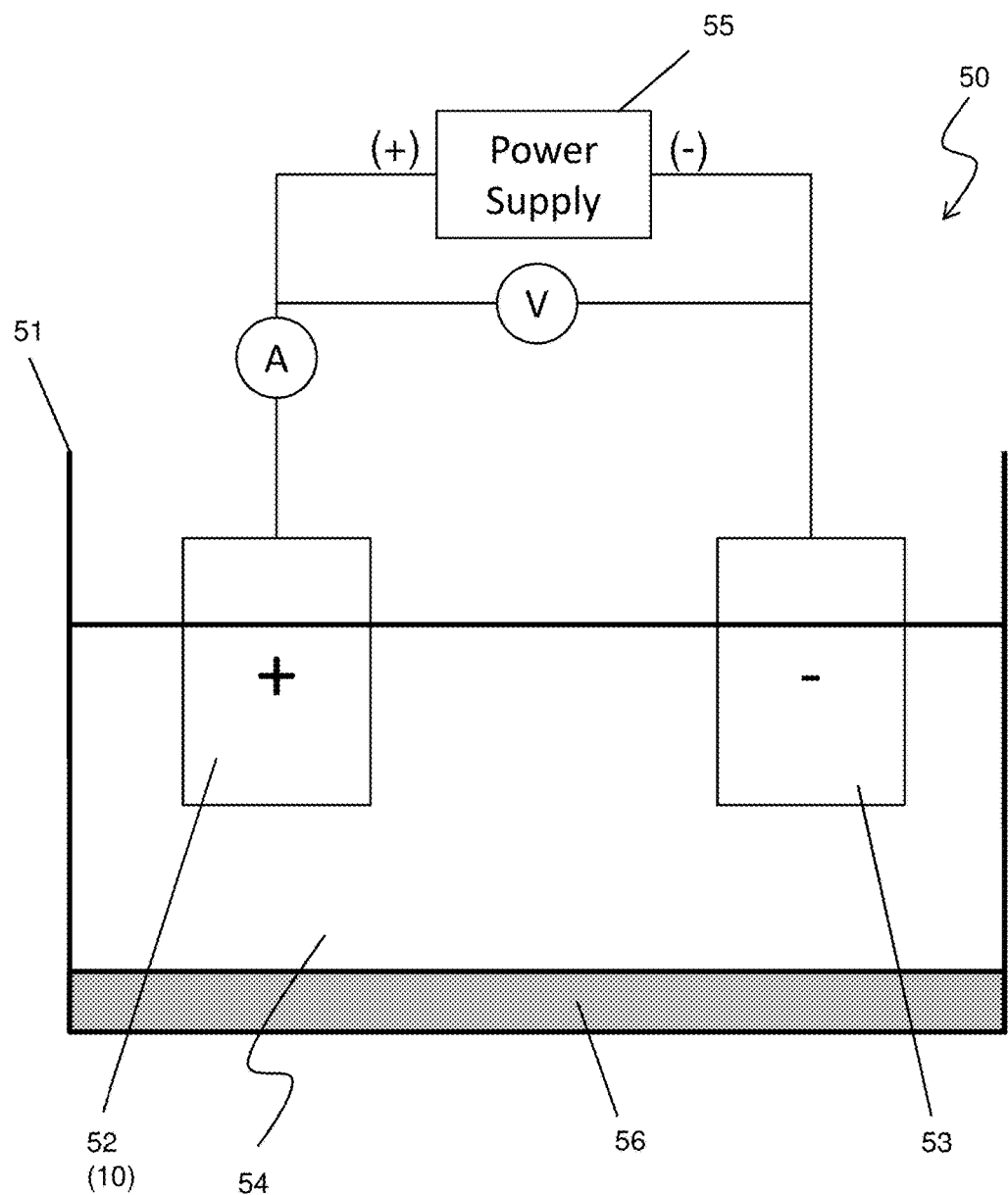
FIG. 4 shows an exemplary anode oxidation apparatus according to one embodiment of the present disclosure.

FIG. 4 shows an exemplary anode oxidation apparatus according to one embodiment of the present disclosure. The anode oxidation apparatus 50 includes a vessel 51, in which an electrolyte solution 54 is stored, and a power supply 55. An anode electrode 52 connected to a positive terminal of the power supply 55 and a cathode electrode 53 connected to a negative terminal of the power supply 55 are immersed in the electrolyte solution 54. In anode oxidation of the aluminum body, the anode electrode 52 is the aluminum body 10. The cathode electrode 53 is made of, for example, lead (Pb) or carbon. The anode oxidation apparatus 50 further includes a temperature controller 56 which controls the temperature of the electrolyte solution 54 and includes a heater and a chiller.

The electrolyte solution 54 can be an alkaline solution or an acid solution. In some embodiments, the electrolyte solution 54 is an aqueous solution of sulfuric acid $H_2SO_4$ with a weight percent in a range from about 10% to about 20%. Oxalic acid $(COOH)_2$ may be used instead of or in addition to sulfuric acid.

The power supply 50 can apply DC, AC and/or pulse voltage to the electrodes. In an anode oxidation, as the thickness of a formed aluminum oxide layer increases, a growth rate of the aluminum oxide layer decreases. By increasing the voltage value, the growth rate increases. Accordingly, if it is needed to increase the total throughput or the average growth rate, the voltage value is increased, gradually or in a stepwise manner, during the anode oxidation process.

In the present embodiment, however, the voltage value applied in the anode-oxidization is substantially constant in view of obtaining uniform micro/nano structures of the aluminum oxide layer (explained below).

In some embodiments, the substantially constant voltage value is in a range from 15 V to 25 V and variation during the anode-oxidization is equal to or less than 10%. In other words, the "substantially constant" means that a target voltage value is set, for example, at 20V, and during the anode oxidization, the voltage value is adjusted or changed between 22V to 24V. Further, "the substantially constant voltage value is applied during the anode-oxidization" means that the "substantially constant voltage" is applied in the longest time duration of the anode oxidation. Thus, even if a voltage out of the range of, for example, 22V to 24V, is applied for a short period of time (e.g., 10 min), the substantially constant voltage value is applied during the anode-oxidization as long as the "substantially constant voltage" is applied in the longest time duration (e.g., 100 min) of the anode oxidation. The current value during the anode oxidization is in a range from about 1.0 A to 2.0 A in some embodiments.

In some embodiments, the longest time duration starts from the beginning of the anode oxidation process.

In some embodiments, an average growth rate of the aluminum oxide layer 20 in the anode-oxidization is in a range from 30 nm/min to 70 nm/min. The average growth rate can be calculated by the total thickness of the aluminum oxide layer 20 divided by the total anode oxidation time. The thickness T of the aluminum oxide layer 20 is in a range from about 10 μm to about 200 μm in some embodiments, and is in a range from about 20 μm to about 80 μm in other embodiments.

In some embodiments, the anode-oxidization is performed at a temperature from −20° C. to 5° C. The temperature of the electrolyte solution 54 is maintained at this temperature range by controlling the temperature controller 56. In some embodiments, the temperature of the electrolyte solution 54 is maintained at equal to or below about 0° C. In certain embodiments, the temperature of the electrolyte solution 54 is maintained in a range from about −5° C. to about 0° C.

In some embodiments, a pH value of the electrolyte 54 is maintained in a range from about 4.0 to about 5.0. The pH value can be feedback controlled by an ion concentration meter (not shown).

After the anode oxidation of aluminum, the aluminum oxide layer has a porous structure. In S160 of FIG. 3, a sealing process is performed on the as formed aluminum oxide layer.

Figure 5A:
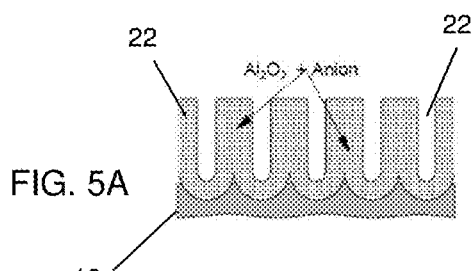
FIGS. 5A-5D show an exemplary sealing process.
Figure 5B:
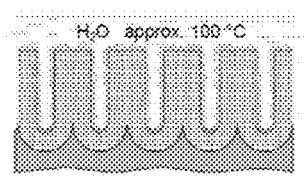

FIGS. 5A-5D show one example of the sealing processes. FIG. 5A shows a schematic structure of the as formed aluminum oxide layer 22 by the anode oxidation. The as formed aluminum oxide layer 22 has pores 24 having a size in a range from about 2 nm to about 10 nm in some embodiments. The as formed aluminum oxide layer 22 is treated by hot water at a temperature more than 75° C. or steam, as shown in FIG. 5B. In some embodiments, the temperature of the hot water is approximately 100° C. (boiling water). When steam is used, the temperature of the steam is more than about 100° C. under a pressure in a range from about 380 Torr to about 1000 Torr. In some embodiments, the aluminum body 10 with the as formed aluminum oxide 22 is heated at a temperature in a range from about 90° C. to 110° C. during the sealing process.

Figure 5C:
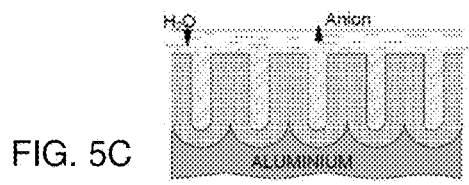
Figure 5D:
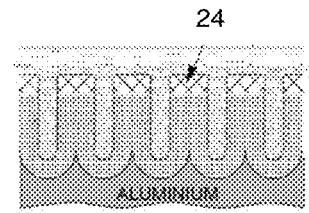

As shown in FIG. 5B, gel formed by $H_2O$ (water or vapor) precipitates on pore walls. Then, as shown in FIG. 5C, the gel is condensed and forms a pseudo-Boehmite layer. During the condensation and Boehmite formation, anions in the aluminum oxide layer 22 diffuses out from the aluminum oxide layer 22. As shown in FIG. 5D, recrystallization occurs at the surface to form the Boehmite phase $(AlOOH)_2$ 24 of aluminum oxide. Eventually, the pores are filled by recrystallized aluminum oxide, and the aluminum oxide layer 20 having the Boehmite phase can be obtained.

Figure 6A:
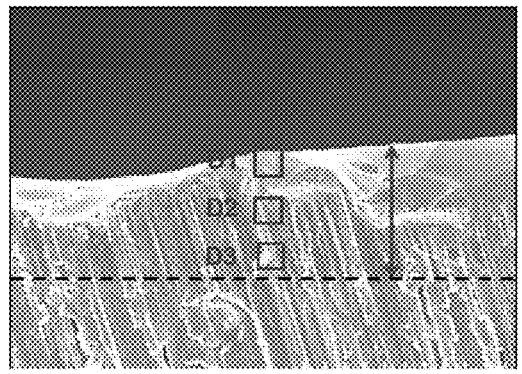
FIGS. 6A-6D show SEM (scanning electron microscope) images of the cross sections of the aluminum oxide layer.
Figure 6B:
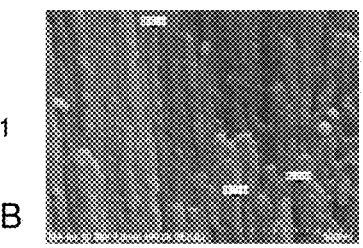
Figure 6C:
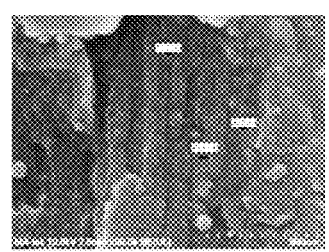
Figure 6D:
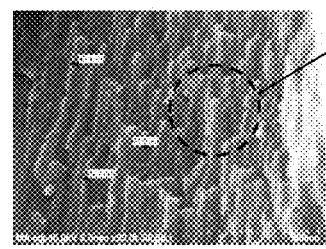
Figure 6E:
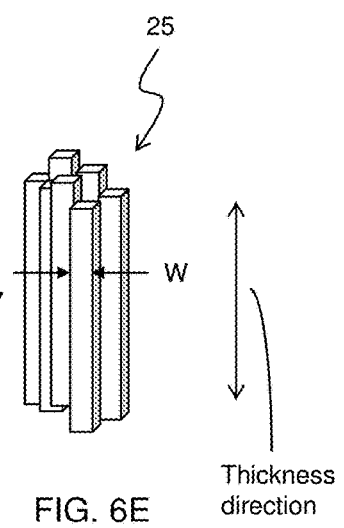
FIG. 6E shows a schematic view illustrating columnar grains of the aluminum oxide layer, according to one embodiment of the present disclosure.

FIGS. 6A-6D show SEM (scanning electron microscope) images of the cross sections of the aluminum oxide layer 20. FIGS. 6B-6D are enlarged view of points D1-D3 shown in FIG. 6A, respectively, and FIG. 6E shows a schematic view illustrating columnar grains 25 of the aluminum oxide layer 20, according to one embodiment of the present disclosure.

As shown in FIGS. 6B-6D, the aluminum oxide layer 20 includes plural columnar grains 25 as a micro/nano structure. The columnar grains are oriented substantially in the thickness direction of the aluminum oxide layer (i.e., the longer side is substantially parallel to the thickness direction). An average width W (see, FIG. 6E) of the columnar grains is in a range from about 10 nm to about 100 nm in some embodiments, and is in a range from about 20 nm to about 50 nm in other embodiments. In certain embodiments, the average width W of the columnar grains is in a range from about 25 nm to about 35 nm.

In the present embodiments, the width of the columnar grains 25 is substantially constant (i.e., the micro/nano structure of the aluminum oxide layer 20 is substantially uniform) from an outer surface of the aluminum oxide layer to a depth of at least ½ T, where T is a thickness of the aluminum oxide layer 20. In some embodiments, the width of the columnar grains 25 is substantially constant from an outer surface of the aluminum oxide layer 20 to a depth of at least ⅔ T. In certain embodiments, the width of the columnar grains 25 is substantially constant from an outer surface of the aluminum oxide layer 20 to a depth of at least ¾ T. In some embodiments, the width of the columnar grains 25 is substantially constant from the outer surface of the aluminum oxide layer 20 to an interface between the aluminum body 10 and the aluminum oxide layer 20. The depth is, for example, 30 μm in some embodiments, and is 50 μm in other embodiments.

The variation of the width of the columnar grains 25 is within about ±20% of the average width. The grain size of the columnar grains increases as the applied voltage increases. Since, as set forth above, the voltage applied to the aluminum body during the anode oxidation is maintained substantially constant, the width of the columnar grains 25 is substantially constant in the thickness direction. In particular, when the longest time duration in which the applied voltage is substantially constant, starts from the beginning of the anode oxidation process, the width of the columnar grains 25 is substantially constant from the outer surface of the aluminum oxide layer 20 to a certain depth (e.g., 30 μm). The longer the longest time duration becomes, the larger the certain depth is (e.g., 50 μm, 80 μm, etc.).

Figure 7:
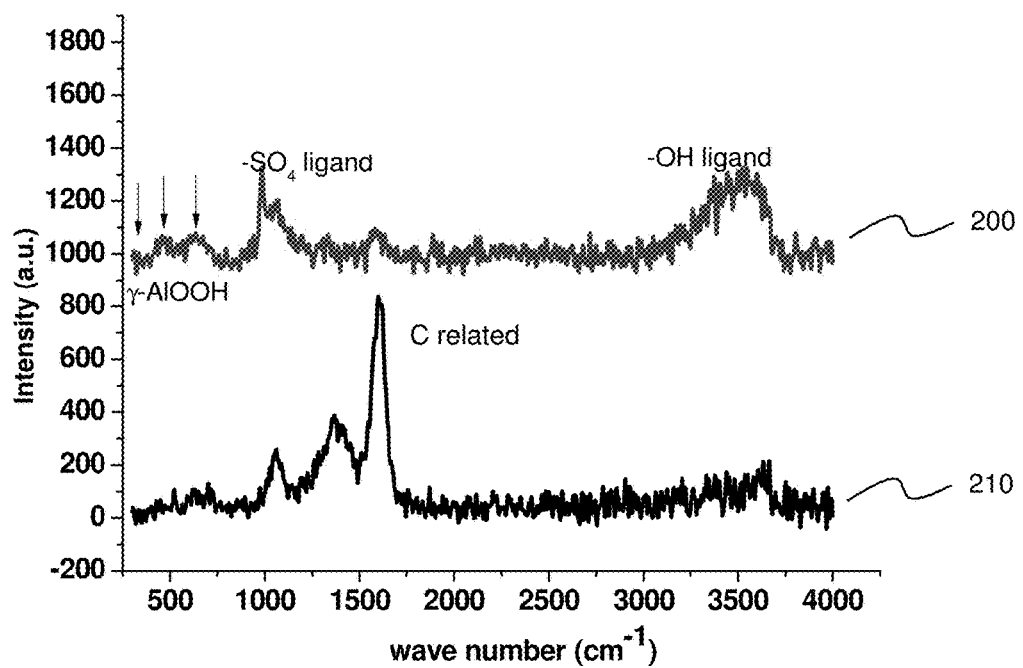
FIG. 7 shows Raman spectra of aluminum oxide layers.

FIG. 7 shows Raman spectra of aluminum oxide layers. Line 200 shows a Raman spectrum of the aluminum oxide layer 20 formed by a method as set forth above, and line 210 shows a Raman spectrum of an aluminum oxide layer formed by the similar method as set forth above except for a sealing process in which $Ni(CH_3COO)_2$ is used instead of hot water/steam.

As shown in FIG. 7, the Raman spectrum 200 for the aluminum oxide layer 20 formed by the method as set forth above (FIG. 3) shows peaks relating to γ-AlOOH (Boehmite phase) between 300 $cm^{-1}$ to 700 $cm^{-1}$, peaks relating to —OH ligand at around 3500 $cm^{-1}$, and peaks relating to —$SO_4$ ligand at 987 $cm^{-1}$ and 1055 $cm^{-1}$. The peaks relating to —$SO_4$ ligand is attributable to the $H_2SO_4$ solution in the anode oxidation. In contrast, the Raman spectrum 210 for the aluminum oxide layer formed by the different sealing method shows no clear peaks relating to γ-AlOOH (Boehmite phase) or —OH ligand, but shows strong peaks relating to carbon (C) at 1363 $cm^{-1}$ and 1602 $cm^{-1}$. The peaks relating to carbon (C) are attributable to the sealing process using $Ni(CH_3COO)_2$.

As shown in FIG. 7, the aluminum oxide layer formed by the different sealing method shows a peak relating to carbon stronger than a peak relating to —$SO_4$ ligand in a Raman spectrum, while the aluminum oxide layer 20 formed by the method as set forth above shows a peak relating to —$SO_4$ ligand stronger than a peak relating to carbon in a Raman spectrum. Similarly, the aluminum oxide layer 20 formed by the method as set forth above shows a peak relating to γ-AlOOH (Boehmite phase) or —OH ligand stronger than a peak relating to carbon in a Raman spectrum.

Figure 8:
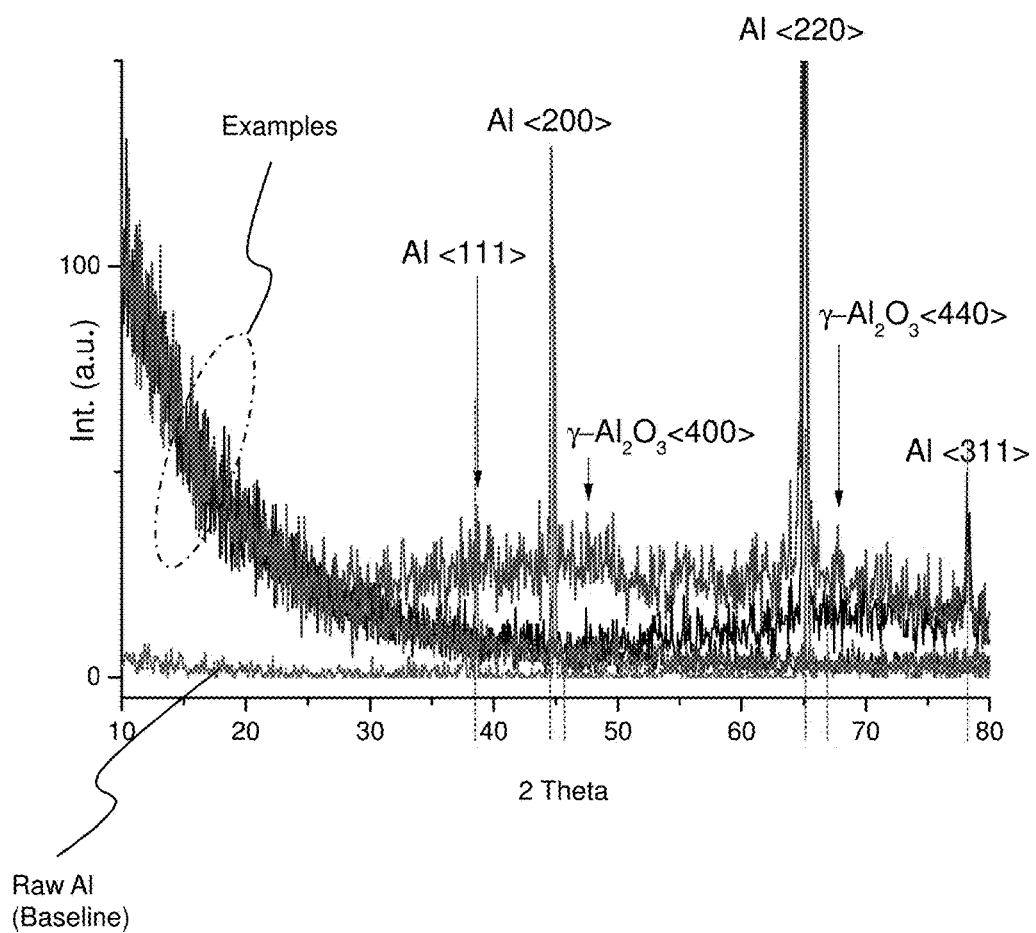
FIG. 8 shows XRD (X-ray diffraction) spectra of aluminum oxide layers.

FIG. 8 shows XRD (X-ray diffraction) spectra of aluminum oxide layers, in which one baseline of a raw aluminum material (bulk aluminum) and four spectra of the aluminum oxide layer 20 formed according to the present method of FIG. 3. Raw Al is a poly crystal FCC structure with <200> and <220> preferred, while γ-$Al_2O_3$ is nearly amorphous. As shown in FIG. 8, the XRD spectra show no clear peak or shows very broad peaks. For example, there are very broad peaks attributable to γ-$Al_2O_3$ (Boehmite) at 2θ=47 and 67, corresponding to <400> and <440> direction. This result shows that the anodized aluminum oxide layer 20 is continuously formed from the aluminum body 10. It is noted that a 2θ difference indicates a lattice mismatch between the anodized aluminum oxide layer 20 and the aluminum body 10, which may lead to stress or cracks.

A hardness (Vickers Hardness) of the aluminum oxide layer 20 is in a range from about 400 HV to 550 HV in some embodiments. A breakdown voltage of the aluminum oxide layer 20 is at least 30 V/μm.

The aluminum body 10 with the aluminum oxide layer 20 can be used for a chamber wall of a vacuum chamber for plasma processes. In addition, the aluminum body 10 with the aluminum oxide layer 20 can be used for parts disposed inside the vacuum chamber, such as a shower head for gas introduction, a wafer stage, and monitoring devices.

The aluminum apparatus formed with the aluminum body 10 with the aluminum oxide layer 20 can improve durability of the vacuum chamber or parts disposed in the vacuum chamber and thus improve stability of the plasma operations when processing plural wafers.

In the plasma processes (etching, CVD, etc.), radicals generated by the plasma attack and etches the inner surface of the vacuum chamber. In particular, when a gas containing fluorine (e.g., $NF_3$ or $F_2$) is used, fluorine radicals generated by the plasma etch the inner surface of the vacuum chamber. The etched surface may generate particles. Further, when a gas containing hydrogen (e.g., $NH_3$ or $H_2$) is used, decomposition and/or recombination of molecules (e.g., $NH_2$ and H from $NH_3$) depend upon the surface condition (e.g., micro/nano structure) of the inner surface of the vacuum chamber.

If the micro/nano structure of the aluminum oxide layer, with which the plasma and/or the radicals are in contact, is not uniform along the depth direction, the surface conditions of the aluminum oxide layer change with cumulative operation time. If the surface conditions change, deposition or etching conditions change with the number of wafers that have been processed, which causes variation of dimensions (thickness, pattern width, etc.) of structures to be formed on the wafers.

In contrast, in the present embodiments, since the micro/nano structure of the aluminum oxide layer is substantially uniform from an outer surface of the aluminum oxide layer (inner surface of the vacuum chamber) to a certain depth, the surface conditions of the aluminum oxide layer do not change with cumulative operation time (at least until the etching proceeds to the certain depth). Accordingly, it is possible to suppress variations of thickness, pattern width, etc. of structures to be formed on the wafers for a longer time (greater number of wafers). With this, it is also possible to increase a maintenance interval of the vacuum chamber. In addition, in the present disclosure, the columnar grains have a relatively small size, which can suppress particles generated during the plasma processes. For example, the uniformity of the thickness of deposited films over wafers can be reduced by ¼, and the number of wafers to be processed without maintenance can be increased four times.

The vacuum chamber using the aluminum oxide layer 20 of the present embodiment can be used for plasma processing using gas including at least one of $NH_3$, $NF_3$, $H_2$, Ar, $H_2O$, $O_2$, and $F_2$, at a pressure in a range from about 0.1 to about 10 Torr, at a power in a range from about 1 to about 6 KW and with a gas flow rate in a range from about 1 to 10 SLM, in some embodiments.

Further, the plasma processing includes plasma CVD using gas including at least one of $NH_3$, $NF_3$, $H_2$, Ar, $H_2O$, $O_2$, and $F_2$, physical vapor deposition using $H_2$ gas, plasma etching using gas including at least one of $NH_3$, $NF_3$, $H_2$, Ar, $H_2O$, $O_2$, and $F_2$, or plasma cleaning using gas including at least one of $NF_3$ and $F_2$.

The various embodiments or examples described herein offer several advantages over the existing art. For example, in the present disclosure, since the micro/nano structure of the aluminum oxide layer is substantially uniform from an outer surface of the aluminum oxide layer (inner surface of the vacuum chamber) to a certain depth, the surface conditions of the aluminum oxide layer do not change with cumulative operation time (at least until the etching proceeds to the certain depth). Accordingly, it is possible to suppress variations of thickness, pattern width, etc. of structures to be formed on the wafers for longer time, to suppress particle generation, and to increase a maintenance interval of the vacuum chamber.

It will be understood that not all advantages have been necessarily discussed herein, no particular advantage is required for all embodiments or examples, and other embodiments or examples may offer different advantages.

According to one aspect of the present disclosure, an aluminum body is chemically treated with at least one of an alkaline solution and an acid solution. Anode-oxidization is performed on the chemically treated aluminum body to form an aluminum oxide layer. The aluminum oxide layer is treated with hot water at a temperature of more than 75° C. or steam. The aluminum oxide layer after being treated with hot water or steam includes plural columnar grains, and an average width of the columnar grains is in a range from 10 nm to 100 nm.

According to another aspect of the present disclosure, an aluminum apparatus comprises an aluminum body and an aluminum oxide layer formed on the aluminum body. The aluminum oxide layer includes plural columnar grains, and an average width of the columnar grains is in a range from 10 nm to 100 nm. The width of the columnar grains is substantially constant from an outer surface of the aluminum oxide layer to a depth of at least ½ T, where T is a thickness of the aluminum oxide layer.

In accordance with yet another aspect of the present disclosure, a method comprises generating plasma in a plasma chamber, and performing at least one of depositing a film, etching and cleaning by using the plasma. The plasma chamber comprises an aluminum body, and an aluminum oxide layer formed on the aluminum body. The aluminum oxide layer is in contact with the generated plasma or radicals generated by the plasma. The aluminum oxide layer includes a Boehmite phase. The aluminum oxide layer includes plural columnar grains, and an average width of the columnar grains is in a range from 10 nm to 100 nm. The width of the columnar grains is substantially constant from an outer surface of the aluminum oxide layer to a depth of at least ½ T, where T is a thickness of the aluminum oxide layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
generating plasma in a plasma chamber; and
performing at least one of depositing a film, etching and cleaning by using the plasma, wherein:
the plasma chamber comprises:
an aluminum body; and
an aluminum oxide layer formed on the aluminum body,
the aluminum oxide layer is in contact with the generated plasma or radicals generated by the plasma,
the aluminum oxide layer includes plural columnar grains, and an average width of the columnar grains is in a range from 10 nm to 100 nm, and
widths of the columnar grains are substantially constant from an outer surface of the aluminum oxide layer to a depth of at least ½ T, where T is a thickness of the aluminum oxide layer.

2. The method of claim 1, wherein the plasma is generated from a gas containing at least one of $NH_3$, $NF_3$, $H_2$ and $F_2$.

3. The method of claim 1, wherein the thickness T of the aluminum oxide layer is in a range from 20 μm to 200 μm.

4. The method of claim 1, wherein the widths of the columnar grains are substantially constant from the outer surface of the aluminum oxide layer to an interface between the aluminum body and the aluminum oxide layer.

5. The method of claim 1, wherein the average width of the columnar grains is has a width from 25 nm to 35 nm.

6. The method of claim 1, wherein the aluminum oxide layer includes a Boehmite phase.

7. The method of claim 1, wherein the aluminum oxide layer shows a peak relating to —$SO_4$ ligand and a peak relating to at least one of Boehmite phase and OH ligand stronger than a peak relating to carbon in a Raman spectrum.

8. A method, comprising:
generating plasma in a plasma chamber; and
performing plasma etching by using the plasma, wherein:
the plasma chamber comprises:
an aluminum body; and
an aluminum oxide layer formed on the aluminum body,
the aluminum oxide layer is in contact with the generated plasma or radicals generated by the plasma,
the aluminum oxide layer includes plural columnar grains, widths of the columnar grains are substantially constant from an outer surface of the aluminum oxide layer to a depth of at least ½ T, where T is a thickness of the aluminum oxide layer, and the plasma is generated from a gas containing at least one of $NH_3$, $NF_3$, $H_2$ and $F_2$.

9. The method of claim 8, wherein widths of the columnar grains are substantially constant from an outer surface of the aluminum oxide layer to a depth of at least ½ T, where T is a thickness of the aluminum oxide layer.

10. The method of claim 8, wherein an average width of the columnar grains is in a range from 10 nm to 100 nm.

11. The method of claim 10, wherein the average width of the columnar grains is has a width from 25 nm to 35 nm.

12. The method of claim 8, wherein the aluminum oxide layer shows a peak relating to —$SO_4$ ligand and a peak relating to at least one of Boehmite phase and OH ligand stronger than a peak relating to carbon in a Raman spectrum.

13. A method, comprising:
generating plasma in a plasma chamber; and
performing at least one of depositing a film, etching and cleaning using the plasma wherein:
the plasma chamber comprises:
an aluminum body; and
an aluminum oxide layer formed on the aluminum body,
the plasma is generated from a gas containing at least one of $NH_3$, $NF_3$, $H_2$ and $F_2$,
the aluminum oxide layer is in contact with the generated plasma or radicals generated by the plasma,
the aluminum oxide layer includes plural columnar grains,
widths of the columnar grains are substantially constant from an outer surface of the aluminum oxide layer to a depth of at least ½T, where T is a thickness of the aluminum oxide layer, and
the aluminum oxide layer is formed by:
chemically treating an aluminum body with at least one of an alkaline solution and an acid solution;
performing anode-oxidation on the chemically treated aluminum body to form the aluminum oxide layer; and
treating the aluminum oxide layer with hot water at a temperature of more than 75° C. or steam.

14. The method of claim 13, wherein a voltage value applied in the anode-oxidization is substantially constant.

15. The method of claim 14, wherein the substantially constant voltage value is in a range from 15 V to 25 V and variation during the anode-oxidization is equal to or less than 10%.

16. The method of claim 13, wherein an average growth rate of the aluminum oxide layer in the anode-oxidization is in a range from 30 nm/min to 70 nm/min.

17. The method of claim 13, wherein the aluminum body before the chemically treating has a surface roughness Ra from 0.5 µm to 1.5 µm.

18. The method of claim 13, wherein an electrolyte in the anode-oxidization includes $H_2SO_4$.

19. The method of claim 13, wherein the anode-oxidization is performed at a temperature of −20° C. to 5° C.

20. The method of claim 13, wherein, before the chemically treating, the aluminum body is annealed at a temperature of 250° C. to 350° C.

* * * * *